(12) United States Patent
Son et al.

(10) Patent No.: US 11,107,800 B2
(45) Date of Patent: Aug. 31, 2021

(54) DISPLAY DEVICE

(71) Applicant: LG Display Co., Ltd., Seoul (KR)

(72) Inventors: HyeonHo Son, Goyang-si (KR); HanSaem Kang, Paju-si (KR); Bogyun Chung, Goyang-si (KR); Sungeun Bae, Jeonju-si (KR); HyungJu Park, Goyang-si (KR); Eunjeong Shin, Daejeon (KR); Jeenmoon Yang, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 62 days.

(21) Appl. No.: 16/727,743

(22) Filed: Dec. 26, 2019

(65) Prior Publication Data
US 2020/0212026 A1    Jul. 2, 2020

(30) Foreign Application Priority Data

Dec. 27, 2018  (KR) .......................... 10-2018-0170091
Nov. 8, 2019   (KR) .......................... 10-2019-0142593

(51) Int. Cl.
   *H01L 25/16*   (2006.01)
   *H01L 27/12*   (2006.01)
(52) U.S. Cl.
   CPC .......... *H01L 25/167* (2013.01); *H01L 27/124* (2013.01)
(58) Field of Classification Search
   CPC ... H01L 25/167; H01L 27/124; H01L 33/502; H01L 33/54; H01L 33/486; H01L 25/0753; H01L 27/1248; H01L 33/505; H01L 33/08; H01L 33/60; H01L 33/06; H01L 33/32; H01L 27/156; H01L 33/42; H01L 27/15; H01L 33/36; H01L 33/62; G09G 3/3233; G09G 3/3241
   USPC ............................................... 257/91; 438/22
   See application file for complete search history.

(56) References Cited

U.S. PATENT DOCUMENTS

| | | | |
|---|---|---|---|
| 2018/0122836 A1* | 5/2018 | Kang | ..................... H01L 33/502 |
| 2018/0174519 A1* | 6/2018 | Kim | ........................ H01L 33/06 |
| 2018/0175268 A1* | 6/2018 | Moon | ..................... H01L 27/15 |

FOREIGN PATENT DOCUMENTS

| KR | 10-2009-0111889 A | 10/2009 |
|---|---|---|
| KR | 10-2013-0044717 A | 5/2013 |

* cited by examiner

*Primary Examiner* — Didarul A Mazumder
(74) *Attorney, Agent, or Firm* — Birch, Stewart, Kolasch & Birch LLP

(57) ABSTRACT

A display device can include a substrate on which a semiconductor element and a common electrode are disposed; a light emitting diode which is disposed on the substrate and includes an n-type layer, a light emitting layer, and a p-type layer; an insulating layer disposed on the substrate and the light emitting diode; and a first connecting electrode which is connected to the light emitting diode and the semiconductor element. Accordingly, it is possible to minimize defects which can be caused during a process of disposing the light emitting diode on the substrate.

20 Claims, 12 Drawing Sheets

DISPLAY DEVICE

CROSS-REFERENCE TO RELATED APPLICATIONS

This application claims the priority of Korean Patent Application No. 10-2018-0170091 filed on Dec. 27, 2018 and Korean Patent Application No. 10-2019-0142593 filed on Nov. 8, 2019, both in the Korean Intellectual Property Office, the disclosures of all of these applications are incorporated herein by reference into the present application.

BACKGROUND

Field

The present disclosure relates to a display device, and more particularly, to a display device using a light emitting diode (LED).

Description of the Related Art

A liquid crystal display device and an organic light emitting display device have advantages such as a high resolution screen, a small thickness, and light-weight. Therefore, the liquid crystal display device and the organic light emitting display device are widely applied to screens of everyday electronic devices such as mobile phones or notebooks and the applicable range of these devices is gradually expanded.

However, the liquid crystal display device and the organic light emitting display device have a limitation in reducing the size of a bezel area which does not display images but is visibly recognized by a user. For example, in the case of the liquid crystal display device, a sealant needs to be used to seal the liquid crystal and bond an upper substrate and a lower substrate, but this creates a limitation in reducing the size of the bezel area. Further, in the case of the organic light emitting display device, an organic light emitting diode which is formed of an organic material is vulnerable to moisture or oxygen so that an encapsulating unit needs to be disposed to protect the organic light emitting diode. Therefore, there is a limitation in reducing the size of the bezel area. As such, when a plurality of liquid crystal display panels or a plurality of organic light emitting display panels are disposed in a tile pattern to implement a super-size screen, a bezel area between the adjacent panels is easily recognized by users.

As an alternative to this, a display device which uses small LEDs as light emitting diodes has been studied. Since the LED is formed of an inorganic material, rather than an organic material, reliability is excellent so that a lifespan of such display device can be longer than that of the liquid crystal display device or the organic light emitting display device. Further, the LED is suitable for a very large screen because it has a fast lighting speed, good emission efficiency, and excellent stability in accordance with strong impact resistance and displays an image having a high luminance.

As a result, a display device including such small LEDs has been searched in various fields and some studies for a display device and a method for manufacturing such display device have been conducted to reduce defects which may be caused during the manufacturing process.

SUMMARY

During the process of disposing a plurality of light emitting diodes on a substrate, a position of some light emitting diodes can be misaligned. Further, some light emitting diodes can be fixed onto the substrate in a misaligned state to be misplaced. When the light emitting diodes are misaligned or misplaced, a short between electrodes can be caused during subsequent processes. Inventors of the present disclosure recognized such problems and that an alternative is necessary to minimize the above-described defects.

An object to be achieved by the present disclosure is to provide a display device which is capable of minimizing defects which can be caused during a process of disposing a light emitting diode on a substrate.

Another object of the present disclosure is to provide a display device and associated method which can address the above-identified and other limitations and problems associated with the related art.

It should be noted that the scope of the claims is not limited to what is described in the description of the present disclosure.

In order to solve the above-described problems, according to an aspect of the present disclosure, a display device includes a substrate on which a semiconductor element and a common electrode are disposed; a light emitting diode (LED) which is disposed on the substrate and includes an n-type layer, a light emitting layer, and a p-type layer; an insulating layer disposed on the substrate and the light emitting diode; and a first connecting electrode which is connected to the light emitting diode and the semiconductor element. Here, the first connecting electrode is disposed on the insulating layer and the first connecting electrode is electrically connected to the p-type layer through a first connecting unit configured by a plurality of fine holes.

According to another aspect of the present disclosure, a display device includes a substrate on which a light emitting diode array including a plurality of light emitting diodes is disposed; a thin film transistor array which is disposed on the substrate and is electrically connected to the light emitting diode array to control the emission of the light emitting diodes; and a structure which suppresses the electrical short problem of the n-type layer and the p-type layer included in the light emitting diode due to the misalignment of the light emitting diode.

Details of other embodiments will be included in the detailed description and the accompanying drawings.

According to the present disclosure, a structure having a specific structure is disposed at a peripheral portion of the light emitting diode to solve the problem in that the electrical short of electrodes of the light emitting diode is caused when the light emitting diode is misaligned on the substrate.

Further, according to the present disclosure, a fine hole is provided on an insulating layer so that even though the light emitting diode is shifted, the light emitting diode and the pixel circuit can maintain a stable connection relationship.

Furthermore, according to the present disclosure, a fine hole is provided on an insulating layer so that even though the light emitting diode is shifted, a problem in that the n electrode and the p electrode of the light emitting diode are electrically shorted can be suppressed.

The effects and advantages of the present disclosure are not limited to the effects and advantages mentioned above and below, and other effects and advantages not mentioned can be clearly understood by those skilled in the art from the following description.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
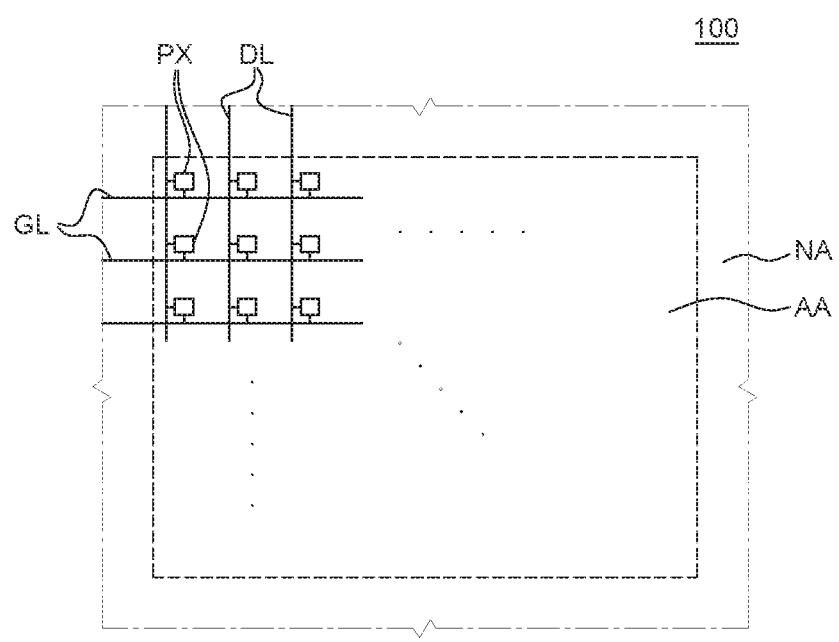
FIG. 1 is a plan view of a display device according to an embodiment of the present disclosure.

Advantages and characteristics of the present disclosure and a method of achieving the advantages and characteristics will be clear by referring to the embodiments described below in detail together with the accompanying drawings. However, the present disclosure is not limited to the embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range (e.g., a tolerance range) even if not expressly stated.

When the position relation between two elements is described using the terms such as "on", "above", "below", and "next", one or more elements can be positioned between the two parts unless the terms are used with the term "immediately" or "directly".

Although the terms "first," "second," and the like are used for describing various components, these components are not confined by these terms. These terms are merely used for distinguishing one component from the other components. Therefore, a first component to be mentioned below can be a second component in a technical concept of the present disclosure.

Each of the features of the various embodiments of the present disclosure can be combined or combined with each other partly or entirely. The features of the various embodiments can be technically interlocked and driven as well. The features of the various embodiments can be practiced independently or in conjunction with each other independently of each other.

Hereinafter, various embodiments of the present disclosure will be described in detail with reference to accompanying drawings.

Figure 2:
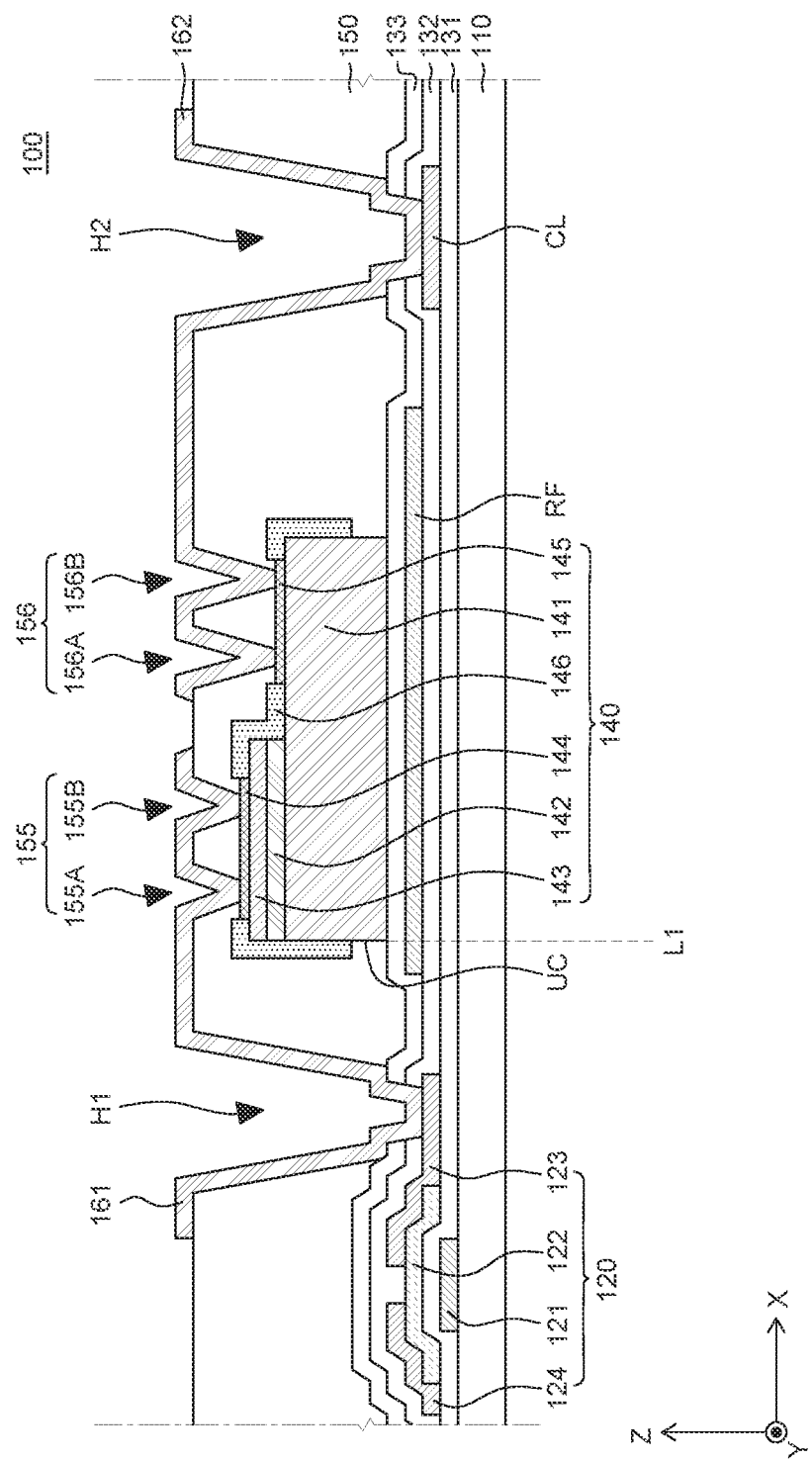
FIG. 2 is a cross-sectional view of a part of a display device according to an embodiment of the present disclosure.
Figure 3:
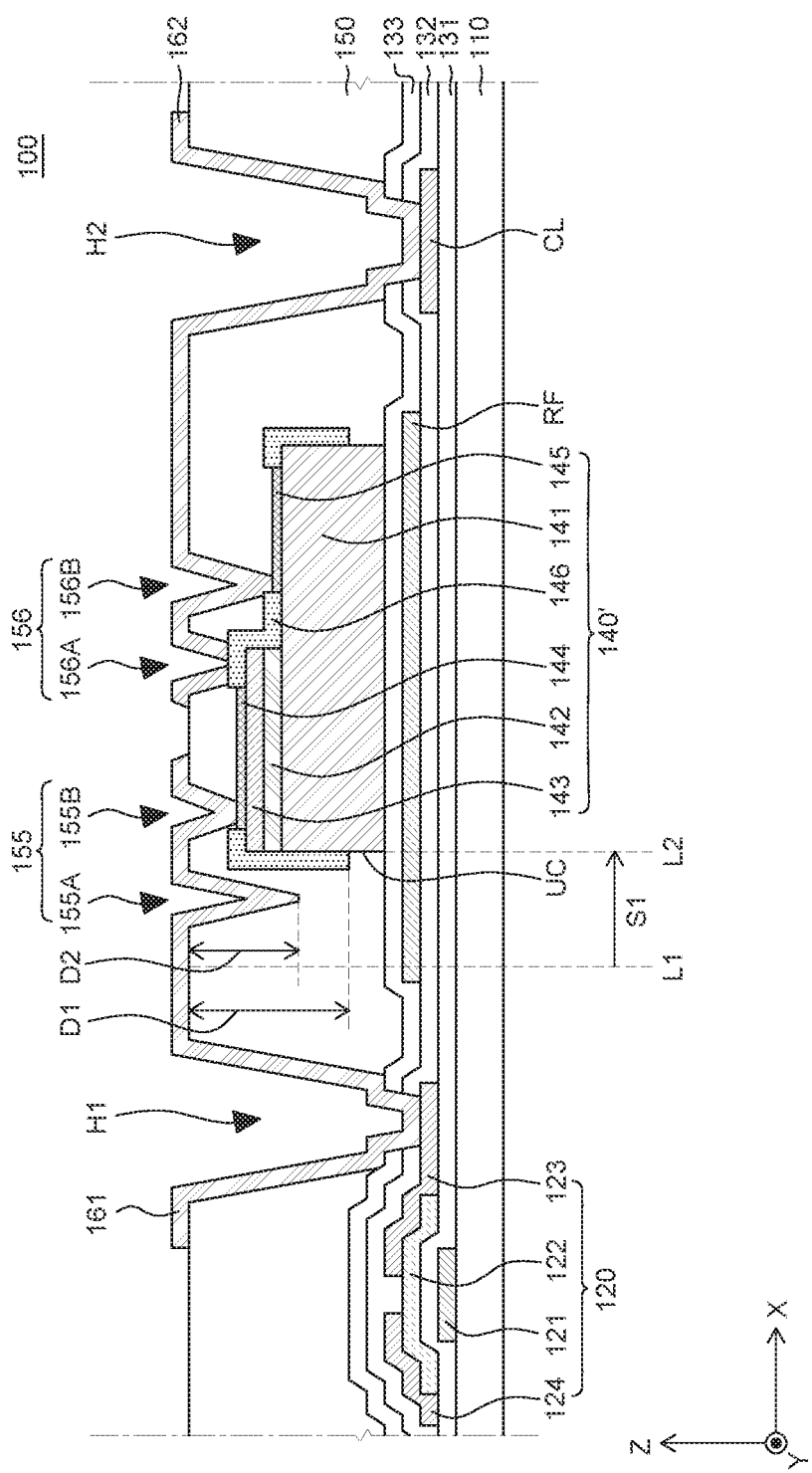
FIG. 3 is a cross-sectional view of a part of a display device according to an embodiment of the present disclosure.

FIG. 1 is a plan view of a display device according to an exemplary embodiment of the present disclosure and FIGS. 2 and 3 are cross-sectional views illustrating a part of a display device according to an embodiment of the present disclosure. All the components of the display device according to all embodiments of the present disclosure are operatively coupled and configured.

A display device 100 illustrated in FIG. 1 includes a display area AA and a non-display area NA. In the display area AA, a plurality of pixels PX is provided and in the non-display area NA, a pad unit which connects the pixels PX and a pixel driving unit is located. In this case, the non-display area NA is distinguished for the purpose of description of the present disclosure but the non-display area NA does not mean a bezel area which is visibly recognized by a user. For example, when a plurality of display devices 100 according to the present disclosure is disposed in a tile pattern, an interval between display devices 100 is not visibly recognized so that a zero bezel is implemented. Therefore, the plurality of tiled display devices 100 can be recognized as one large-size panel. Therefore, the display device 100 according to the embodiment of the present disclosure can be defined to include only the display area AA but not to have a non-display area NA.

The pixel PX (e.g., each pixel PX) is an individual unit which emits light and includes a plurality of light emitting diodes and a plurality of pixel circuits which individually drives the plurality of light emitting diodes.

One pixel PX can be defined as a unit pixel which is configured by a plurality of light emitting diodes which emits different colored light. For example, the pixel PX can include light emitting diodes which emit red light, green light, and blue light, or red, green, blue and white light, or other variations. However, the present disclosure is not limited thereto and for example, the pixel PX can be defined as a sub pixel configured by one light emitting diode. In the meantime, as a light emitting diode, a light emitting diode 140 which is formed of an inorganic material can be used. Normally, when a size is 100 μm or smaller, the light emitting diode 140 is referred to as a micro LED and when a size is 100 μm or larger, the light emitting diode 140 is referred to as a mini LED.

The pixel circuit can include a plurality of semiconductor elements 120. The light emitting diode 140 and the semiconductor element 120 included in the pixel PX can be connected to a pixel driving unit including a gate control circuit and a data control circuit, through a plurality of wiring lines such as gate lines GL and data lines DL. In the meantime, the light emitting diode 140, the pixel circuit, and the plurality of wiring lines can be disposed above the substrate 110 and the pixel driving unit can be disposed below the substrate 110. Further, a plurality of connecting lines which connects the pixel PX and the pixel driving unit can be disposed on a side surface of the substrate 110.

FIG. 2 is a vertical cross-sectional view illustrating a semiconductor element 120, a light emitting diode 140, and a structure enclosing the same. Referring to FIG. 2, a display device 100 according to an embodiment of the present disclosure includes a substrate 110, the semiconductor element 120, a gate insulating layer 131, a passivation layer 132, a reflective layer RF, an adhesive layer 133, the light emitting diode 140, an insulating layer 150, and connecting electrodes 161 and 162.

The substrate 110 is a substrate which supports various functional elements and can be formed of an insulating material. For example, the substrate 110 can include glass or polyimide. When the substrate 110 has flexibility, the substrate 110 can further include a back plate coupled to a rear surface of the substrate 110 to reinforce the substrate 110. The back plate can include a plastic material, and for example, can include a polyethylene terephthalate material.

The semiconductor element 120 is disposed on the substrate 110. The semiconductor element 120 can be used as a driving element of the display device 100. The semiconductor element 120 can be a thin film transistor (TFT), an N-channel metal oxide semiconductor (NMOS), a P-channel metal oxide semiconductor (PMOS), a complementary metal oxide semiconductor (CMOS), a field effect transistor FET, or the like, but is not limited thereto. In the following description, it is assumed that the plurality of semiconductor elements 120 is thin film transistors, but is not limited thereto.

The semiconductor element 120 includes a gate electrode 121, an active layer 122, a source electrode 123, and a drain electrode 124.

The gate electrode 121 is formed on the substrate 110. The gate electrode 121 can be formed of a conductive material such as copper (Cu), aluminum (Al), molybdenum (Mo), titanium (Ti), or an alloy thereof, but is not limited thereto.

The gate insulating layer 131 is disposed on the gate electrode 121. The gate insulating layer 131 is a layer for insulating the gate electrode 121 from the active layer 122 and can be formed of an insulating material. For example, the gate insulating layer 131 can be configured by a single layer or a double layer of silicon oxide SiOx or silicon nitride SiNx, but is not limited thereto.

The active layer 122 is disposed on the gate insulating layer 131. For example, the active layer 122 can be formed of an oxide semiconductor, amorphous silicon, or polysilicon, but is not limited thereto.

The source electrode 123 and the drain electrode 124 are disposed on the active layer 122 to be spaced apart from each other. The source electrode 123 and the drain electrode 124 can be electrically connected to the active layer 122. The source electrode 123 and the drain electrode 124 can be formed of a conductive material such as copper (Cu), aluminum (Al), molybdenum (Mo), titanium (Ti), or an alloy thereof, but are not limited thereto.

The passivation layer 132 is disposed on the semiconductor element 120. The passivation layer 132 is provided to protect elements disposed below the passivation layer 132, for example, the semiconductor element 120. The passivation layer 132 can be configured by a single layer or a double layer of silicon oxide SiOx or silicon nitride SiNx, but is not limited thereto. The passivation layer 132 can include a first hole H1 for electrically connecting the semiconductor element 120 and the first connecting electrode 161 and a second hole H2 for electrically connecting a common line CL and the second connecting electrode 162.

A buffer layer can be disposed between the substrate 110 and the semiconductor element 120. The buffer layer can minimize diffusion of moisture or impurities from the substrate 110 to the upper portion of the substrate 110. The buffer layer can be configured by a single layer or a double layer of silicon oxide SiOx or silicon nitride SiNx, but is not limited thereto.

A gate line GL is disposed on the gate insulating layer 131. The gate line GL can be disposed on the same layer as the gate electrode 121 and the gate line GL can be formed of the same material as the gate electrode 121. The gate line GL can extend in one direction to overlap the display area AA and the non-display area NA. The data line DL can also be formed with the same purpose as the gate line GL and extend in a different direction from the gate line GL.

The common line CL is disposed on the gate insulating layer 131. The common line CL is a wiring line for applying a common voltage to the light emitting diode 140 and can be disposed to be spaced apart from the gate line GL or the data line DL. The common line CL can extend in the same direction as the gate line GL or the data line DL. The common line CL can be formed of the same material as the source electrode 123 and the drain electrode 124 or can be formed of the same material as the gate electrode 121.

The reflective layer RF is disposed on the passivation layer 132. The reflective layer RF is a layer for improving luminous efficiency of the light emitting diode 140. The reflective layer RF reflects light directed to the substrate 110, among light emitted from the light emitting diode 140, toward the upper portion of the display device 100 to be output to the outside of the display device 100. The reflective layer RF can be formed of a metal material having a high reflectance, and for example, can include silver (Ag), aluminum (Al), or the like. In the meantime, pure silver (Ag) can react with oxygen or nitrogen so that the reflectance can be lowered. Therefore, the reflective layer RF can be formed of a multiple layer of ITO/Ag/ITO or formed by adding impurities such as palladium (Pd) or copper (Cu).

The adhesive layer 133 is disposed on the reflective layer RF. The adhesive layer 133 is a layer for fixing the light emitting diode 140 onto the substrate 110 and can insulate the reflective layer RF formed of a metal material from the light emitting diode 140. However, the adhesive layer is not necessarily limited thereto. When the light emitting diode is a vertical type in which one electrode therebelow is exposed, the adhesive layer 133 can include a conductive material so as to electrically connect one electrode of the light emitting diode to the reflective layer RF. The adhesive layer 133 can be formed of a thermosetting material or a photo curing material and can be any one selected from adhesive polymer, epoxy resin, UV resin, a polyimide based material, an acrylate based material, a urethane based material, and polydimethylsiloxane (PDMS), but is not limited thereto.

The adhesive layer 133 can include a first hole H1 for electrically connecting the semiconductor element 120 and the first connecting electrode 161 and a second hole H2 for electrically connecting a common line CL and the second connecting electrode 162. In this case, the first hole H1 and the second hole H2 included in the adhesive layer 133 can have a larger diameter than that of the first hole H1 and the second hole H2 included in the passivation layer 132. In the meantime, as illustrated in FIG. 2, the adhesive layer 133 can be disposed on the entire surface of the substrate 110, but is not necessarily limited thereto. In some embodiments, the adhesive layer 133 can be patterned to have an island shape to overlap the light emitting diode 140.

The light emitting diode 140 is disposed on the adhesive layer 133 to overlap the reflective layer RF. The light emitting diode 140 includes an n-type layer 141, an active layer 142, a p-type layer 143, an n electrode 145, a p electrode 144, and an encapsulating layer 146. Hereinafter, it is described that the light emitting diode 140 is a lateral type LED, but is not necessarily limited thereto. For example, it can be described that the light emitting diode 140 is a vertical type LED in some embodiments.

The n-type layer 141 is a semiconductor layer in which free electrons having a negative charge move as carriers to generate an electric current and can be formed of an n-GaN based material. The n-GaN based material can be GaN, AlGaN, InGaN, or AlInGaN and Si, Ge, Se, Te, or C can be used as an impurity used for doping the n-type layer 141. Further, in some cases, a buffer layer, such as an undoped GaN based semiconductor layer, can be additionally formed between a growth substrate and the n-type layer 141.

The active layer 142 is disposed on the n-type layer 141 and can have a multi quantum well (MQW) structure having a well layer and a barrier layer having a higher band gap than that of the well layer. For example, the active layer 142 can have a multi quantum well structure such as InGaN/GaN.

The p-type layer 143 is a semiconductor layer in which holes having a positive charge move as carriers to generate an electric current and can be formed of a p-GaN based material. The p-GaN based material can be GaN, AlGaN, InGaN, or AlInGaN and Mg, Sn, or Be can be used as an impurity used for doping the p-type layer 143.

The p electrode 144 is formed on the p-type layer 143 to form ohmic contact. The p electrode 144 can be a transparent conductive material such as indium tin oxide (ITO) or indium zinc oxide (IZO), but is not limited thereto. Further, the n electrode 145 is disposed on the n-type layer 141 for ohmic contact. The n electrode 145 can be formed of the same material as the p electrode 144.

The encapsulating layer 146 is disposed on the n-type layer 141 and the p-type layer 143 to protect the n-type layer 141 and the p-type layer 143. The encapsulating layer 146 can also be referred to as a protective layer 146 and can be formed of $SiO_2$, $Si_3N_4$, or a resin. The encapsulating layer 146 can be disposed on the entire surface of the light emitting diode 140 excluding the lower portion of the light emitting diode 140. However, parts of the p electrode 144 and the n electrode 145 are exposed by the encapsulating layer 146 and the p electrode 144 and the n electrode 145 can be in ohmic contact with the first connecting electrode 161 and the second connecting electrode 162, respectively, through the exposed area. In some embodiments, the encapsulating layer 146 may not be formed in at least a part of the side surface of the light emitting diode 140. Specifically, the encapsulating layer 146 may not be formed on one side surface of the lighting emitting diode 140 on which only the n-type layer 141 is disposed without the p-type layer 143. Further, the light emitting diode 140 as described above can be disposed on the substrate 110 while exposing the n-type layer 141.

The insulating layer 150 is disposed on the semiconductor element 120. The insulating layer 150 can be formed of an organic material such as photo acryl, polyimide, benzocyclobutene resin, or acrylate resin, but is not limited thereto.

The insulating layer 150 can be disposed so as to cover the entire surface of the substrate 110. Further, the insulating layer 150 is disposed so as to be adjacent to the side surface of the light emitting diode 140 so that the light emitting diode 140 can be more firmly fixed onto the substrate 110. The insulating layer 150 can include a first hole H1 for electrically connecting the semiconductor element 120 and the first connecting electrode 161 and a second hole H2 for electrically connecting the common line CL and the second connecting electrode 162. In this case, the first hole H1 and the second hole H2 included in the insulating layer 150 can have a larger diameter than that of the first hole H1 and the second hole H2 included in the adhesive layer 133.

The insulating layer 150 can planarize a space between the plurality of light emitting diodes 140. The insulating layer 150 compensates the step on the substrate 110 due to the semiconductor element 120 and the reflective layer RF to allow the connecting electrodes 161 and 162 to be smoothly connected to the semiconductor element 120 and the common line CL.

The insulating layer 150 is disposed so as to enclose not only the side portion of the light emitting diode 140, but also the upper portion thereof. Therefore, the insulating layer 150 can more firmly fix the light emitting diode 140 which is aligned on the substrate 110 onto the substrate 110. To this end, a height of the insulating layer 150 can be larger than a maximum height of the light emitting diode 140. The light emitting diode 140 illustrated in FIG. 2 is a vertical type LED in which the p-type layer 143 is disposed on the n-type layer 141 and in this case, the height of the insulating layer 150 can be higher than the p-type layer 143, the p electrode 144, or the encapsulating layer 146.

The insulating layer 150 includes a first connecting unit 155 and a second connecting unit 156. The first connecting unit 155 includes a first fine hole 155A and a second fine hole 155B and the second connecting unit 156 includes a first fine hole 156A and a second fine hole 156B. FIG. 2 is a vertical cross-sectional view illustrating a light emitting diode 140 and an X-Z plane of a structure at the periphery of the light emitting diode 140. In the meantime, the fine holes 155A and 155B included in the first connecting unit 155 expose the p electrode 144 and the fine holes 156A and 156B included in the second connecting unit 156 expose the n electrode 145. In some embodiments, the p electrode 144 and the n electrode 145 can be omitted. In this case, the fine holes 155A and 155B included in the first connecting unit 155 expose a part of the p-type layer 143 and the fine holes 156A and 156B included in the second connecting unit 156 expose a part of the n-type layer 141. Since the position of the p electrode 144 is higher than that of the n electrode 145, the depths of the fine holes 155A and 155B included in the first connecting unit 155 can be smaller than depths of the fine holes 156A and 156B included in the second connecting unit 156. Further, an area of the p electrode 144 exposed by the fine holes 155A and 155B included in the first connecting unit 155 can be larger than an area of the n electrode 145 exposed by the fine holes 156A and 156B included in the second connecting unit 156.

The first connecting electrode 161 is disposed on the insulating layer 150 and the light emitting diode 140. The first connecting electrode 161 electrically connects the p electrode 144 of the light emitting diode 140 and the thin film transistor 120 through the first connecting unit 155. For example, the first connecting electrode 161 is electrically connected to the source electrode 123 through the first hole H1 and is electrically connected to the p-type layer 143 through the first connecting unit 155. When the display device 100 is a top emission type, the first connecting electrode 161 can be formed of a transparent conductive material and when the display device 100 is a bottom emission type, the first connecting electrode 161 can be formed of a reflective conductive material. The transparent conductive material can be indium tin oxide (ITO) or indium zinc oxide (IZO), but is not necessarily limited thereto. The reflective conductive material can be Al, Ag, Au, Pt, or CU, but is not necessarily limited thereto.

The second connecting electrode 162 is disposed on the insulating layer 150 and the light emitting diode 140. The second connecting electrode 162 is disposed to be spaced apart from the first connecting electrode 161 and electrically connects the n electrode 145 of the light emitting diode 140 to the common line CL. For example, the second connecting electrode 162 is electrically connected to the common line CL through the second hole H2 and is electrically connected to the n-type layer 141 through the second connecting unit 156. The second connecting electrode 162 can be formed of the reflective conductive material or can be formed of the same material as the first connecting electrode 161. The reflective conductive material can be Al, Ag, Au, Pt, or Cu, but is not necessarily limited thereto.

In the meantime, after moving the light emitting diode 140 onto the substrate 110, a predetermined pressure is applied to the light emitting diode 140 to be primarily bonded onto the adhesive layer 133. During this process, positions of some light emitting diodes 140 are shifted or move to the side to be misaligned. Further, when the light emitting diode 140 moves onto the substrate 110 by a transferring apparatus, the light emitting diode 140 can be misplaced on the substrate 110 due to an alignment error of the transferring apparatus. As described above, some light emitting diodes 140 can be misaligned or misplaced on the substrate 110 to be fixed thereto and in this case, several problems can be caused.

A light emitting diode 140 illustrated in FIG. 2 is an example in which an end is disposed in a right position L1 and a light emitting diode 140' illustrated in FIG. 3 is an example in which an end is misplaced in a position L2 which is shifted from the right position L1 by a first distance S1. The first distance S1 by which the light emitting diode 140' is shifted from the right position L1 can be several micrometers or shorter. The inventors of the present disclosure found that the first distance S1 which is a very small value can be a very sensitive defect factor depending on a size of the light emitting diode 140' and invented various embodiments to solve the problem. The only difference between the display device 100 illustrated in FIGS. 1 and 2 and the display device 100 illustrated in FIG. 3 is positions of the light emitting diodes 140 and 140', but other configurations are substantially the same so that a redundant description will be omitted. In the meantime, the display device 100 according to an embodiment of the present disclosure can include the light emitting diode 140 illustrated in FIG. 2 or the light emitting diode 140' illustrated in FIG. 3. The only difference between the light emitting diode 140' illustrated in FIG. 3 and the light emitting diode 140 illustrated in FIG. 2 is a position disposed on the substrate 110, but the structure is the same so that the light emitting diodes are denoted by different reference numerals for the convenience of description.

The plurality of light emitting diodes 140 is formed on a separate growth substrate and then separated from the growth substrate through a substrate separating process to be moved onto the substrate 110. The plurality of light emitting diodes 140 disposed on the substrate 110 can be referred to as a light emitting diode array. For the substrate separating process of separating the plurality of light emitting diodes 140 from the growth substrate, a laser lift off (LLO) process or a chemical lift off (CLO) process can be applied. In this case, the light emitting diode 140 or 140' is separated from the growth substrate so that a part of the encapsulating layer 146 which is adjacent to the growth substrate can be removed together with the growth substrate. Therefore, the light emitting diode 140 or 140' separated from the growth substrate can include an exposing unit UC which is located on a side surface and exposes a part of the n-type layer 141. The light emitting diodes 140 and 140' can be disposed on the substrate 110 while exposing a part of the n-type layer 141 through the exposing unit UC. The insulating layer 150 according to the embodiment of the present disclosure is disposed so as to completely cover the exposing unit UC to suppress an unnecessary signal from being applied to the n-type layer 141. For example, the exposing unit UC can be electrically insulated by the insulating layer 150.

Since the light emitting diode 140' is shifted from the right position L1 by the first distance S1 so that as one end of the light emitting diode 140' is misplaced or misaligned in the position L2, at least a part of the first connecting unit 155 may not overlap the p electrode 144. To be more specific, referring to FIG. 3, as the light emitting diode 140' is shifted by the first distance S1 so that one end of the light emitting diode 140' is disposed in the position L2, the fine hole 155A included in the first connecting unit 155 does not overlap the light emitting diode 140'. Further, the first fine hole 155A is formed to an intermediate depth D2 of the insulating layer 150. A diameter of the first fine hole 155A formed on an upper surface of the insulating layer 150 is sufficiently small so that the first connecting electrode 161 which is filled in the first fine hole 155A is not in contact with the exposing unit UC. For example, a second depth D2 which is a maximum depth of the first fine hole 155A formed from an upper portion of the insulating layer 150 can be smaller than a first depth D1 which is a minimum distance to an exposing unit UC of the light emitting diode 140' formed from the upper portion of the insulating layer 150. Therefore, the exposing unit UC of the misaligned or misplaced light emitting diode 140' is maintained to be electrically insulated by the insulating layer 150 and the n-type layer 141 and the p-type layer 143 can also be maintained to be electrically insulated from each other. Further, the exposing unit UC of the light emitting diode 140' is not in contact with the first connecting electrode 161 disposed on the first fine hole 155A so that the source electrode 123 and the n-type layer 141 can be maintained to be electrically insulated from each other.

The second fine hole 155B included in the first connecting unit 155 overlaps the p electrode 144 and the p electrode 144 and the thin film transistor 120 are electrically connected by the first connecting electrode 161 which is filled in the second fine hole 155B. In the meantime, the maximum diameters of the fine holes 155A and 155B included in the first connecting unit 155 can be the same and a maximum diameter and the number of first fine holes 155A can be determined depending on the contact resistance between the first connecting electrode 161 and the p electrode 144. In other words, the size of the fine holes 155A and 155B included in the first connecting unit 155 is smaller than the size of the first hole H1 so that the contact resistance between the connecting electrode 161 and the thin film transistor 120 which are connected to each other through the fine holes 155A and 155B can also be high. Therefore, in order to implement the same level of contact resistance as the contact resistance between the connecting electrode 161 and the thin film transistor 120 which are connected to each other through the first hole H1, at least two fine holes 155A and 155B can be provided. For example, a maximum size of the first hole H1 formed on the upper surface of the insulating layer 150 can be 8 to 10 micrometers and a maximum size of fine holes 155A, 155B, 156A, and 156B can be 3 to 5 micrometers, but is not limited thereto.

Next, referring to FIG. 3, since the light emitting diode 140' is shifted by a first distance S1 so that one end of the light emitting diode 140' is misplaced or misaligned in the position L2, at least a part of the second connecting unit 156 may not overlap the n electrode 145. Therefore, the first fine hole 156A included in the second connecting unit 156 can overlap the encapsulating layer 146 between the p electrode 144 and the n electrode 145. In this case, the insulating layer 150 can expose a part of the encapsulating layer 146 by the first fine hole 156A and the second connecting electrode 162 which is filled in the first fine hole 156A is in contact with the encapsulating layer 146. In contrast, the first fine hole 156A does not overlap the p electrode 144 so that the p electrode 144 and the n electrode 145 can be maintained to be electrically insulated from each other.

The second fine hole 156B included in the second connecting unit 156 overlaps the n electrode 145 and the n electrode 145 and the common line CL are electrically connected by the second connecting electrode 162 which is filled in the second fine hole 156B. In some embodiments, due to the misalignment or misplacement of the light emitting diode 140', at least some fine holes 156B included in the second connecting unit 156, for example, the second fine hole 156B may not overlap the light emitting diode 140'.

In some embodiments, the maximum diameters of the fine holes 156A and 156B included in the second connecting unit 156 can be larger than the maximum diameters of the fine holes 155A and 155B included in the first connecting unit 155. Alternatively, the second connecting unit 156 can be formed as a single connecting unit without having a plurality of fine holes 156A and 156B. If the light emitting diode 140' moves to an opposite direction to the first distance S1 illustrated in FIG. 3, for example, a minus direction of the X-axis, a maximum depth of the second connecting unit 156 formed from the upper portion of the insulating layer 150 can be larger than the first depth D1 illustrated in FIG. 3. Accordingly, the second connecting electrode 162 can be electrically connected to the exposing unit UC through the second connecting unit 156. However, also in this case, since the common line CL is normally connected to the n-type layer 141 through the second connecting electrode 162, the light emitting diode 140' can normally operate.

In some embodiments, the encapsulating layer 146 may not be provided on a side surface of the light emitting diode which is close to the n electrode 145 and is far from the p electrode 144. As described above, when one entire side surface of the light emitting diode on which the encapsulating layer 146 is not formed is an exposing unit UC, the second fine hole 156B included in the second connecting unit 156 and the second connecting electrode 162 filled in the second fine hole 156B can be in contact with the exposing unit UC. However, since the n-type layer 141 and the common line CL are electrically connected to each other by the second connecting electrode 162, the light emitting diode can normally operate.

The fine holes 156A and 156B included in the second connecting unit 156 can have the same diameter. Further, a maximum diameter and the number of second fine holes 156B can be determined depending on the contact resistance between the second connecting electrode 162 and the n electrode 145. The maximum diameter of the first fine holes 155A and 155B or the second fine holes 156A and 156B can be 2 to 4 micrometers and the size of the first fine holes 155A and 155B can be the same as the size of the second fine holes 156A and 156B. However, the sizes of the fine holes 155A, 155B, 156A, and 156B are not necessarily limited thereto.

In the display device 100 according to the embodiment of the present disclosure, a structure including fine holes 155A, 155B, 156A, and 156B is disposed at the periphery of the light emitting diode 140 or 140'. Therefore, even if the light emitting diode 140' is misplaced or misaligned on the substrate 110, the failure that the p electrode 144 is electrically disconnected from the exposing unit UC can be thoroughly suppressed.

Further, the display device 100 according to the embodiment of the present disclosure includes a structure in which even though some of the fine holes 155A and 155B formed on the insulating layer 150 does not overlap the light emitting diode 140' due to the misplacement or the misalignment of the light emitting diode 140 or 140' on the substrate 110, the first connecting electrode 161 and the p electrode 144 are stably connected.

Further, the display device 100 according to the embodiment of the present disclosure includes a structure in which even though some of the fine holes 156A and 156B formed on the insulating layer 150 does not overlap the n electrode 145 due to the misplacement or the misalignment of the light emitting diode 140 or 140' on the substrate 110, the second connecting electrode 162 and the n electrode 145 are stably connected.

The reflective layer RF can have the same shape and the same size at every pixel PX. Referring to FIGS. 2 and 3, when one end of the light emitting diode 140 or 140' is disposed in the right position L1 or disposed even in a position L2 other than the right position L1, the reflective layer RF can be disposed to have a larger cross-section than that of the light emitting diodes 140 or 140' to overlap the light emitting diodes 140 or 140'.

Figure 4A:
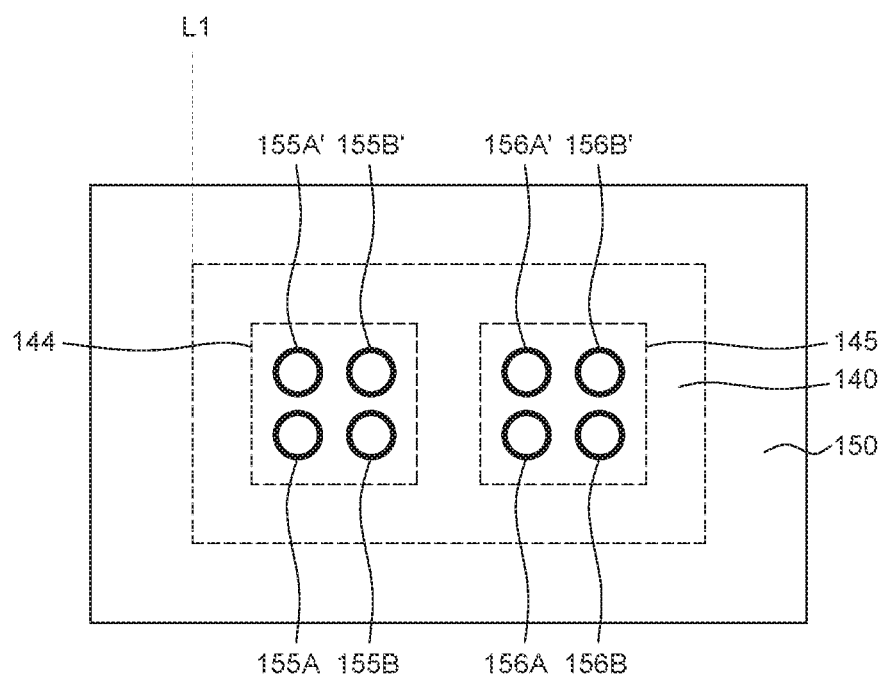
FIGS. 4A to 4D are plan cross-sectional views illustrating various embodiments of the display device illustrated in FIGS. 1 to 3.
Figure 4B:
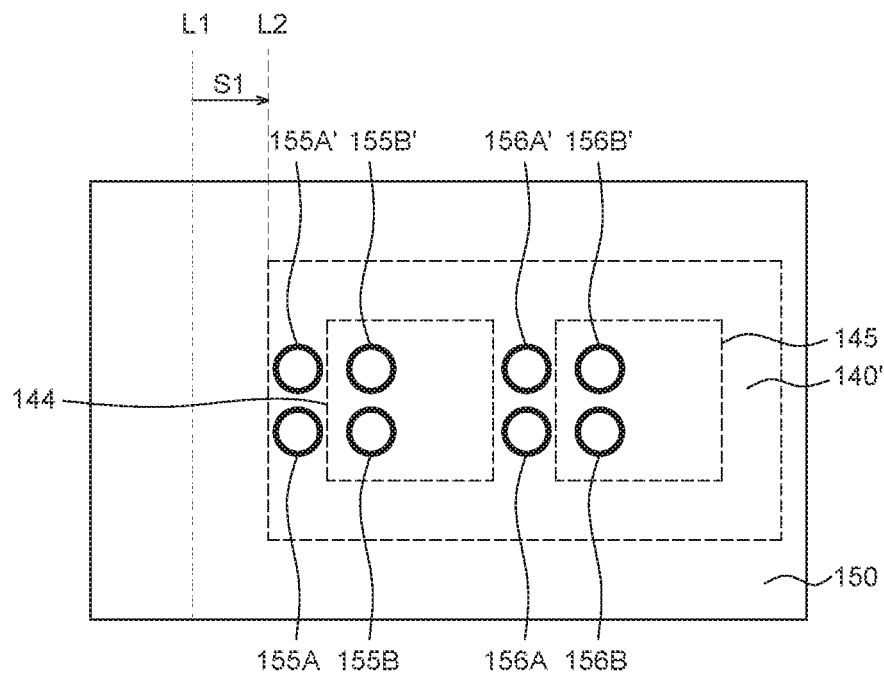

FIGS. 4A to 4D are plan cross-sectional views illustrating various embodiments of the display device illustrated in FIGS. 1 to 3. In FIGS. 4A to 4D, for better understanding of various embodiments of a first connecting unit 155 and a second connecting unit 156, only a part of the light emitting diodes 140 or 140' and the insulating layer 150 is illustrated and other components are omitted. Referring to FIGS. 4A and 4B, the first connecting unit 155 and the second connecting unit 156 can further include fine holes 155A', 155B', 156A', and 156B' disposed to be adjacent to the fine holes 155A, 155B, 156A, and 156B described above. For example, the first connecting unit 155 includes first fine holes 155A and 155A' and second fine holes 155B and 155B' and the second connecting unit 156 includes first fine holes 156A and 156A' and second fine holes 156B and 156B'.

FIG. 4A illustrates the light emitting diode 140 whose one end is disposed in the right position L1 and the first connecting unit 155 and the second connecting unit 156 in the display device 100 illustrated in FIG. 2. The position where the first connecting unit 155 and the second connecting unit 156 are formed is always the same, regardless of the position of the light emitting diode 140 or 140'. Therefore, a relative position relationship between the first connecting unit 155 and the second connecting unit 156 and the p electrode 144 and the n electrode 145 is determined depending on the position where the light emitting diode 140 or 140' is disposed. For example, when one end of the light emitting diode 140 is disposed in the right position L1, the fine holes 155A, 155A', 155B, and 155B' included in the first connecting unit 155 overlap the p electrode 144 of the light emitting diode 140. Further, the fine holes 156A, 156A', 156B, and 156B' included in the second connecting unit 156 overlap the n electrode 145 of the light emitting diode 140. In this case, as illustrated in FIG. 4A, there is no need that all fine holes 155A, 155A', 155B, and 155B' included in the first connecting unit 155 overlap the p electrode 144 and all fine holes 156A, 156A', 156B, and 156B' included in the second connecting unit 156 overlap the n electrode 145. For example, even though the light emitting diode 140 is disposed in the right position L1, some of fine holes may not overlap the p electrode 144 or the n electrode 145. However, the size, the position, and the number of fine holes can be desirably designed such that the number of fine holes overlapping the p electrode 144 and the n electrode 145 when the light emitting diode 140 is disposed in the right position L1 is larger than the number of fine holes overlapping the p electrode 144 and the n electrode 145 when the light emitting diode 140 is disposed in the position L2 other than the right position L1.

FIG. 4B illustrates a light emitting diode 140' whose one end is disposed in a position L2 other than the right position L1, among light emitting diodes 140 and 140' included in the display device 100 illustrated in FIG. 3 and the first connecting unit 155 and the second connecting unit 156. As the light emitting diode 140' is disposed in the position L2, some fine holes 155A and 155A' of the first connecting unit 155 can be shifted from the p electrode 144. Even though in FIG. 4B, it is illustrated that the first fine holes 155A and 155A' included in the first connecting unit 155 overlap the light emitting diode 140, like the first fine hole 155A illustrated in FIG. 3, the first fine holes 155A and 155A' may not overlap the light emitting diode 140'. In this case, the first fine holes 155A and 155A' do not reach the exposing unit UC below the light emitting diode 140, so that the p electrode 144 and the n-type layer 141 can be maintained to be insulated from each other. In the meantime, the first fine holes 156A and 156A' included in the second connecting unit 156 are disposed to deviate from the n electrode 145, but do not overlap the p electrode 144 so that the p electrode 144 and the n electrode 145 can be maintained to be electrically insulated. By doing this, the display device 100 can normally operate, regardless of misplacement or misalignment of the light emitting diodes 140 and 140'.

According to another embodiment of the present disclosure, even though one end of the light emitting diode 140 is disposed in the right position L1, some of fine holes included in the first connecting unit 155 or the second connecting unit 156 may not overlap the light emitting diode 140. In this case, the depth of the fine holes which do not overlap the light emitting diode 140 is formed so as not to be in contact with the exposing unit UC, so that the n-type layer 141 and the p-type layer 143 can be maintained to be electrically insulated from each other. Further, some of the fine holes included in the first connecting unit 155 or the second connecting unit 156 is always disposed to overlap the p electrode 144 or the n electrode 145 so that the light emitting diode 140 can normally operate.

In the drawings of the present disclosure, it is illustrated that the fine holes included in each connecting unit can be disposed in a matrix, but is not necessarily limited thereto. For example, the fine holes can be disposed in a circular shape, or disposed in a shape corresponding to the shape of the p electrode 144 or the n electrode 145, or disposed in a shape corresponding to an opening of the encapsulating layer 146.

Figure 4C:
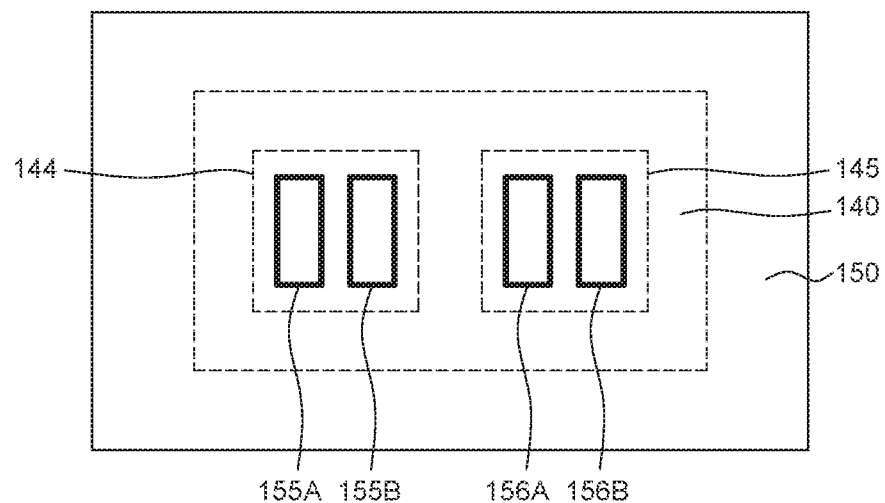
Figure 4D:
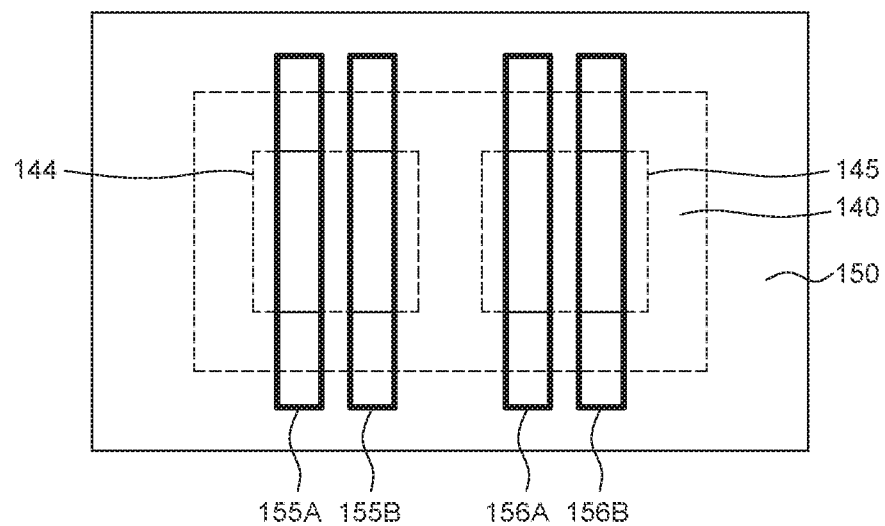

FIGS. 4C and 4D illustrate various embodiments of fine holes 155A, 155B, 156A, and 156B included in the first connecting unit 155 and the second connecting unit 156. Even though the fine holes 155A, 155A', 155B, 155B', 156A, 156A', 156B, 156B' illustrated in FIGS. 4A and 4B have a circular shape in a plan view, as illustrated in FIGS. 4C and 4D, the fine holes 155A, 155B, 156A, 156B can have a rectangular shape or a slit shape extending in one direction or other shapes and configurations. Referring to FIG. 4C, the fine holes 155A, 155B, 156A, and 156B can have a shape included in the p electrode 144 or the n electrode 145 and referring to FIG. 4D, the fine holes can have a shape which extends over so as to be deviated from the p electrode 144 or the n electrode 145. As illustrated in FIGS. 4C and 4D, when the fine holes 155A, 155B, 156A, and 156B are formed to have a slit shape, a contact resistance between the connecting electrodes 161 and 162 and the p electrode 144 and the n electrode 145 is large as compared with the case that the fine holes 155A, 155B, 156A, and 156B have a circular shape. Therefore, the stable connection can be provided. Further, even though the light emitting diode 140 or 140' is shifted not only to the X-axis direction, but also to the Y-axis direction, the electrodes can be connected with more stable contact resistance. Further, even though the light emitting diode 140 or 140' is shifted to the Y-axis direction to be misplaced, the depth of the fine holes 155A, 155B, 156A, and 156B illustrated in FIG. 4D is not formed so as to be in contact with the exposing unit UC. Therefore, even though the light emitting diode 140 or 140' is shifted to the X-axis direction or the Y-axis direction, the first connecting electrode 161 and the n-type layer 141 can be maintained to be electrically insulated.

Figure 5:
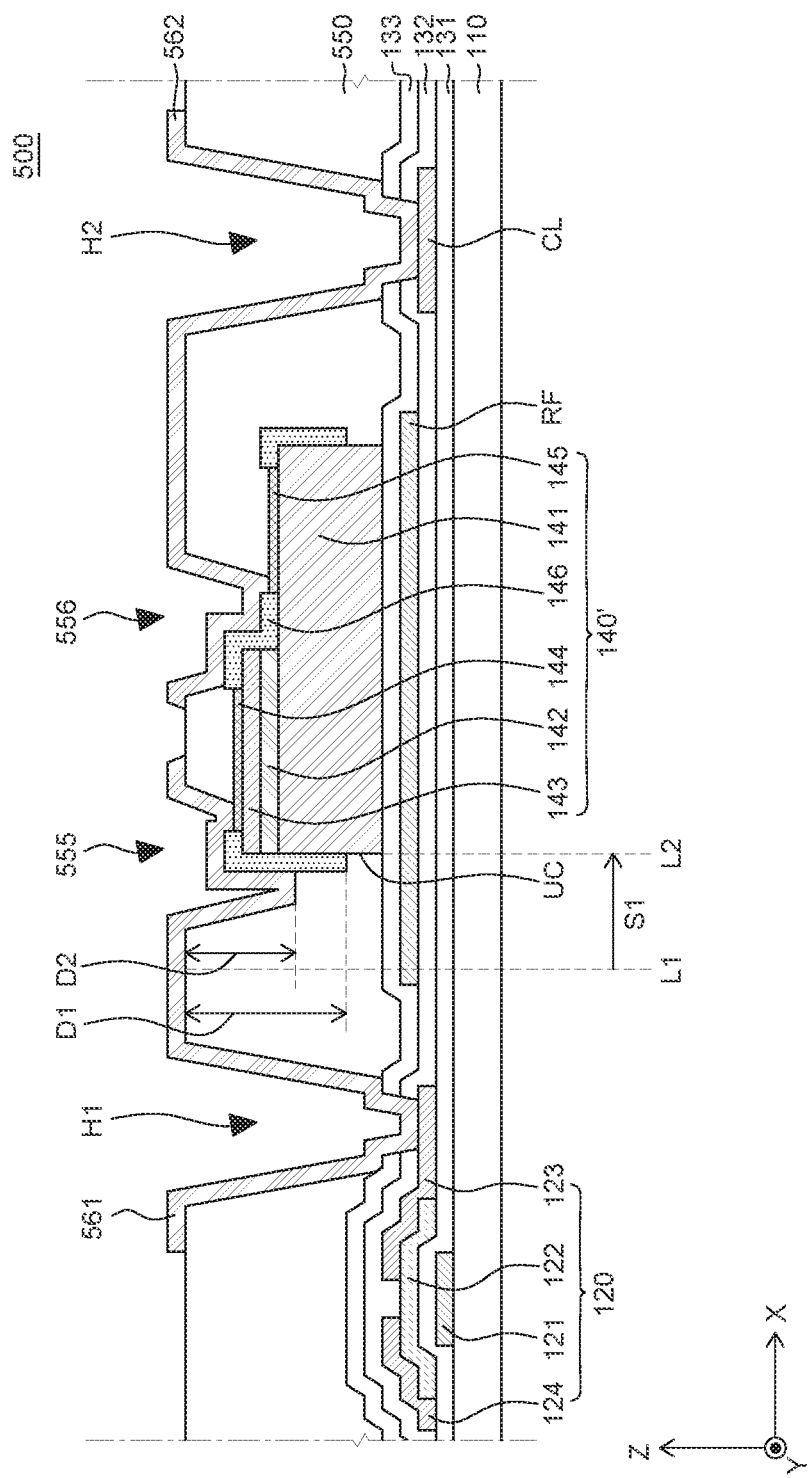
FIG. 5 is a cross-sectional view of a part of a display device according to another embodiment of the present disclosure.

FIG. 5 is a cross-sectional view of a part of a display device according to another embodiment of the present disclosure.

The only difference between a display device 500 illustrated in FIG. 5 and the display device 100 of FIGS. 2 and 3 may be an insulating layer 550, but other configuration is substantially the same or similar Therefore, a redundant description will be omitted or will be brief.

The display device 500 includes a substrate 110 and an insulating layer 550 disposed on a light emitting diode 140'. The insulating layer 550 includes a first connecting unit 555 and a second connecting unit 556. Each of the first connecting unit 555 and the second connecting unit 556 can be configured to include one hole, rather than a plurality of holes, unlike the first connecting unit 155 and the second connecting unit 156 illustrated in FIG. 2. A first connecting electrode 561 is disposed on the insulating layer 550 including the first connecting unit 555. The first connecting electrode 561 electrically connects a source electrode 123 of a thin film transistor 120 and a p-type layer 143 to each other through a first hole H1 and the first connecting unit 555. The second connecting electrode 562 is disposed on the insulating layer 550 including the second connecting unit 556. The second connecting electrode 562 electrically connects a common line CL and an n-type layer 141 to each other through a second hole H2 and the second connecting unit 556.

With reference to the display device 100 illustrated in FIG. 2 and the display device 500 illustrated in FIG. 5, as illustrated in FIG. 5, the light emitting diode 140' can be disposed to be spaced apart from the light emitting diode 140 disposed in the right position L1 with a first distance S1 in an X-axis direction. For example, during a process of disposing the light emitting diode 140' on the substrate 110, one side of the light emitting diode 140' is shifted from the right position L1 by the first distance S1 and thus the light emitting diode 140' can be misplaced in a position L2. Therefore, at least a part of the first connecting unit 555 may not overlap the light emitting diode 140' and the first connecting unit 555 which does not overlap the light emitting diode 140' can be etched from an upper portion of the insulating layer 550 as much as a second depth D2. In order to normally operate the light emitting diode 140', the n-type layer 141 and the p-type layer 143 need to be maintained to be electrically insulated from each other. Therefore, the second depth D2 of the first connecting unit 555 needs to be formed to be smaller than a first depth D1 which is a depth to an exposing unit UC through which a part of the n-type layer 141 is exposed.

Figure 6A:
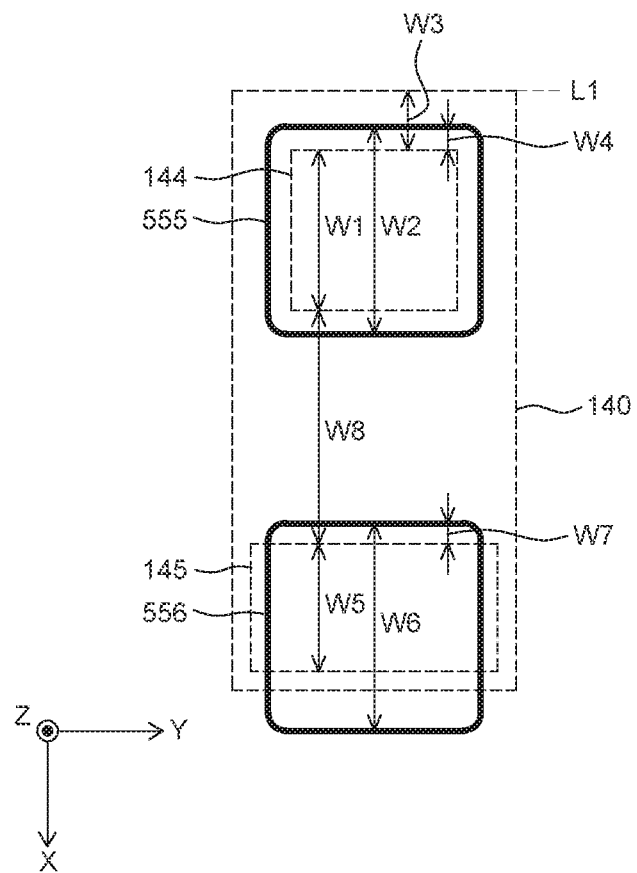
FIGS. 6A to 6C are plan views illustrating various embodiments of the display device illustrated in FIG. 5.
Figure 6B:
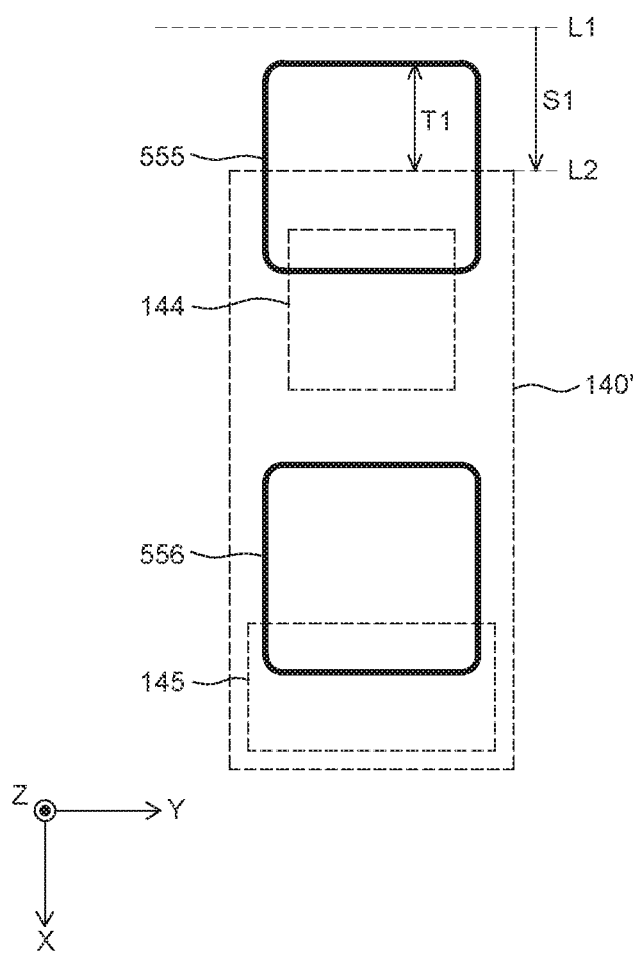
Figure 6C:
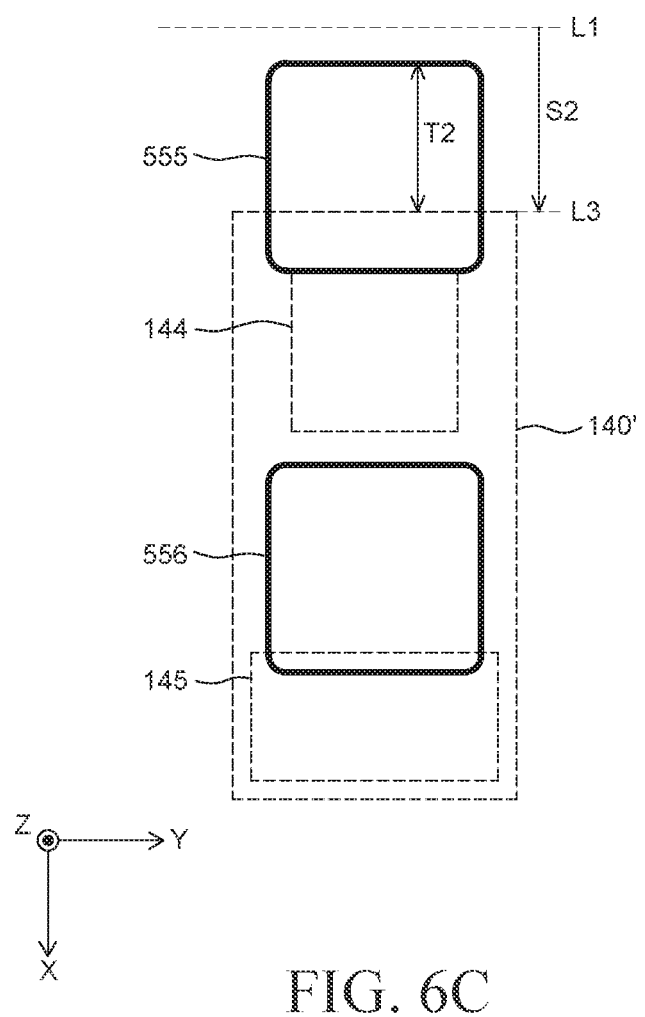

FIGS. 6A to 6C are plan views illustrating various embodiments of the display device illustrated in FIG. 5. More specifically, FIGS. 6A to 6C are plan views of the display device 500 as seen from a top surface. FIG. 6A is a light emitting diode 140 disposed in a right position L1, FIG. 6B is a light emitting diode 140' which is shifted from the right position L1 by the first distance S1, and FIG. 6C is a light emitting diode 140' which is shifted from the right position L1 by a second distance S2. Further, the first connecting unit 555 and the second connecting unit 556 illustrated in FIGS. 6A to 6C are examples designed to be larger than an n electrode 145 and a p electrode 144 of the light emitting diodes 140 and 140'. For example, the light emitting diodes 140 and 140' illustrated in FIGS. 6A to 6C are designed such that a width W2 of the first connecting unit 555 is larger than a width W1 of the p electrode 144 and a width W6 of the second connecting unit 556 is larger than a width W5 of the n electrode 145.

In the meantime, in some embodiments, the p electrode 144 and the n electrode 145 of the light emitting diodes 140 and 140' can be omitted. In this case, the p electrode 144 described in the present specification can be described as a second exposing unit through which a part of the p-type layer 143 is exposed by an encapsulation layer 146 and the n electrode 145 can be described as a first exposing unit through which a part of the n-type layer 141 is exposed by the encapsulating layer 146. As compared with the light emitting diode 140 illustrated in FIG. 6A, the light emitting diode 140' illustrated in FIGS. 6B and 6C is shifted from the right position L1, but the structure is substantially the same so that a redundant description will be omitted.

The light emitting diode 140' illustrated in FIG. 6B is shifted from the right position L1 by the first distance S1 so that an end is disposed in a position L2. Therefore, the light emitting diode 140' can have an area which does not overlap the first connecting unit 555. However, a partial area of the first connecting unit 555 overlaps the p electrode 144 so that the first connecting electrode 561 can be electrically connected to the p-type layer 143. Accordingly, the light emitting diode 140' can normally operate. In this case, a distance T1 from an edge of the light emitting diode 140' to an edge of the first connecting unit 555 is the same as a difference between the first distance S1 and a distance from the edge of the light emitting diode 140' to the edge of the first connecting unit 555. In summary, when a distance W3 from the edge of the light emitting diode 140' to the edge of the p electrode 144 is a2 and a distance W4 from the edge of the first connecting unit 555 to the edge of the p electrode 144 is a3, the distance T1 from the edge of the light emitting diode 140' to the edge of the first connecting unit 555 can be represented as "first distance S1−(a2−a3)".

The light emitting diode 140' illustrated in FIG. 6C is shifted from the right position L1 by a second distance S2 so that an end is disposed in a position L3. In this case, the first connecting unit 555 does not overlap the p electrode 144 so that the first connecting electrode 561 is electrically insulated from the p-type layer 143. Therefore, the light emitting diode 140' may not normally operate. In this case, when a width W2 of the first connecting unit 555 is a1, a distance T2 from the edge of the light emitting diode 140' to the edge of the first connecting unit 555 can be represented as "a1−a2".

In order to normally operate the light emitting diodes 140 and 140', the distance T1 from the edge of the light emitting diode 140' illustrated in FIG. 6B to the edge of the first connecting unit 555 needs to be smaller than the distance T2 from the edge of the light emitting diode 140' illustrated in FIG. 6C to the edge of the first connecting unit 555. For example, in order to suppress an open failure in which the first connecting electrode 561 and the p-type layer 143 are electrically insulated from each other, an inequation "(first distance S1−a2+a3)<(a1−a2)" needs to be satisfied. Therefore, in order to suppress the open failure of the light emitting diodes 140 and 140', the first distance S1 needs to be smaller than "a1−a3". As described above, when the first distance S1 by which the light emitting diodes 140 and 140' included in each pixel PX is shifted from the right position L1 is efficiently managed, a failure rate can be significantly reduced.

In the light emitting diodes 140 and 140' of some embodiments, a distance W8 between the p electrode 144 and the n electrode 145 can be smaller than a width W6 of the second connecting unit 556. Further, the second distance S2 of the light emitting diode 140' can be larger than a difference between the distance W8 between the p electrode 144 and the n electrode 145 and a distance W7 from the edge of the second connecting unit 556 to the edge of the n electrode 145. In other words, when the distance W8 between the p electrode 144 and the n electrode 145 is b and the distance W7 from the edge of the second connecting unit 556 to the edge of the n electrode 145 is c2, it is assumed that the second distance S2 of the light emitting diode 140' is larger than "b−c2". In this case, the p electrode 144 can simultaneously overlap the first connecting unit 555 and the second connecting unit 556 and thus the p-type layer 143 and the n-type layer 141 are electrically connected so that the light emitting diode 140' may not normally operate. In order to suppress the short failure of the light emitting diodes 140 and 140', the second distance S2 is desirably controlled to have a value smaller than "b−c2". In the meantime, when the distance W8 between the p electrode 144 and the n electrode 145 is larger than the width W6 of the second connecting unit 556, the possibility of the horizontal short failure as described above can be lowered. However, the width W1 of the p electrode 144 and the width W5 of the n electrode 145 are relatively reduced so that the possibility of the open failure of the p electrode 144 and the n electrode 145 is increased. As described above, the failure rate can be significantly reduced by efficiently controlling the position where the light emitting diodes 140 and 140' included in each pixel PX are disposed.

Figure 7A:
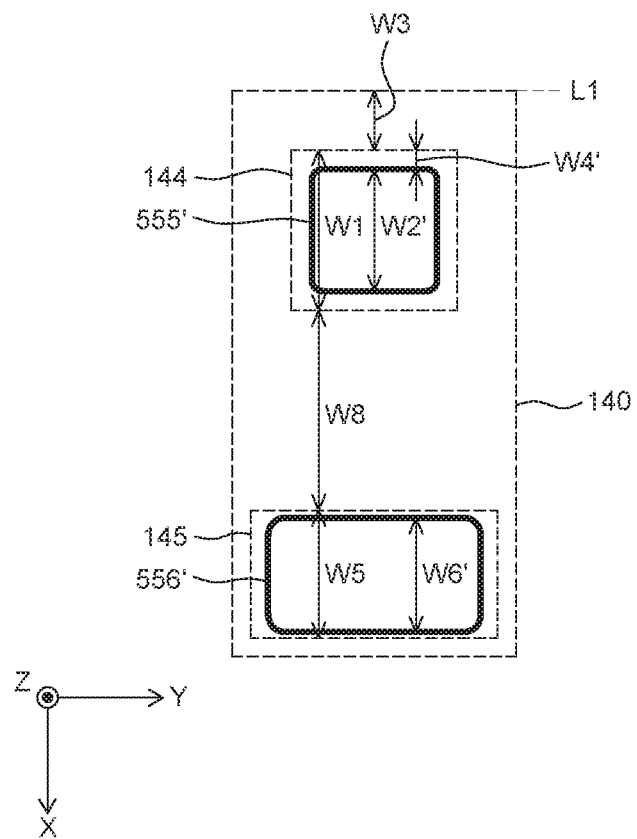
FIGS. 7A to 7C are plan views illustrating various embodiments of the display device illustrated in FIG. 5.
Figure 7B:
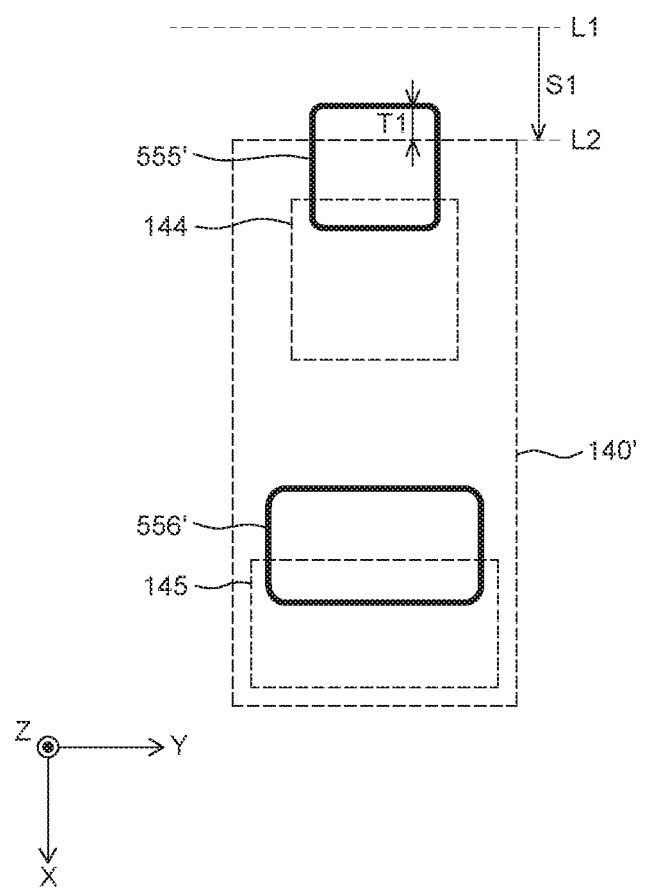
Figure 7C:
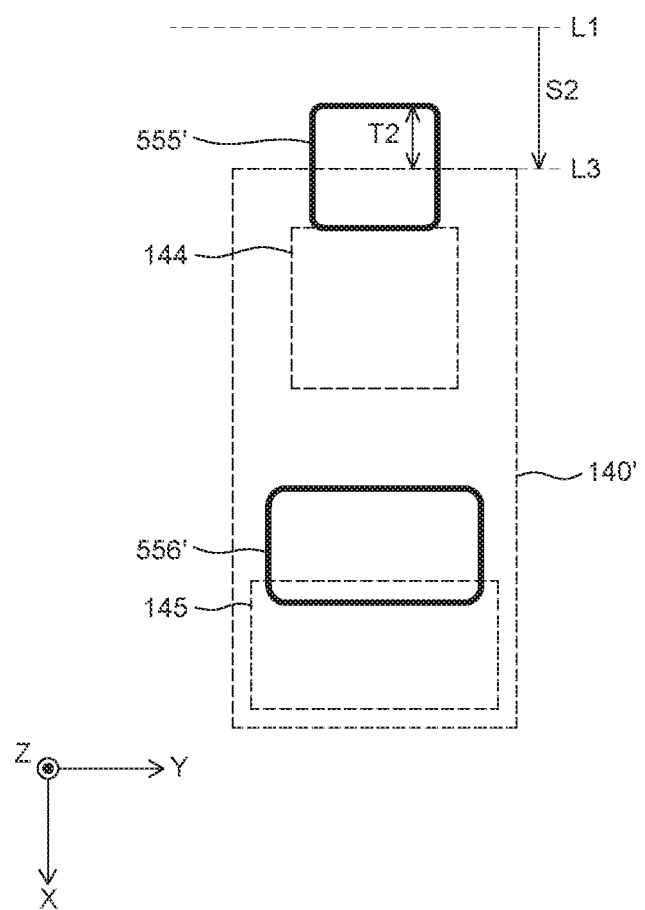

FIGS. 7A to 7C are plan views illustrating various embodiments of the display device illustrated in FIG. 5. Particularly, FIGS. 7A to 7C are plan views of the display device 500 as seen from a top surface. FIG. 7A is a light emitting diode 140 disposed in a right position L1, FIG. 7B is a light emitting diode 140' which is shifted from the right position L1 by the first distance S1, and FIG. 7C is a light emitting diode 140' which is shifted from the right position L1 by a second distance S2. Further, a first connecting unit 555' and a second connecting unit 556' illustrated in FIGS. 7A to 7C are designed to be smaller than an n electrode 145 and a p electrode 144 of the light emitting diodes 140 and 140'. For example, the light emitting diodes 140 and 140' illustrated in FIGS. 7A to 7C are designed such that a width W2' of the first connecting unit 555' is smaller than a width W1 of the p electrode 144 and a width W6' of the second connecting unit 556' is smaller than a width W5 of the n electrode 145. As compared with the light emitting diode 140 illustrated in FIG. 7A, the light emitting diode 140' illustrated in FIGS. 7B and 7C is shifted from the right position L1, but the structure is substantially the same so that a redundant description will be omitted.

The light emitting diode 140' illustrated in FIG. 7B is shifted from the right position L1 by the first distance S1 so that an end is disposed in a position L2. In this case, the first connecting unit 555 partially overlaps the p electrode 144 so that the first connecting electrode 561 is electrically connected to the p-type layer 143. Therefore, the light emitting diode 140' can normally operate. In this case, a distance T1 from an edge of the light emitting diode 140' to an edge of the first connecting unit 555 is the same as a difference between the first distance S1 and a distance from the edge of the light emitting diode 140' to the edge of the first connecting unit 555'. In summary, when a distance W3 from the edge of the light emitting diode 140' to the edge of the p electrode 144 is a2 and a distance W4' from the edge of the first connecting unit 555' to the edge of the p electrode 144 is a3, the distance T1 from the edge of the light emitting diode 140' to the edge of the first connecting unit 555' can be represented as "first distance S1−(a2+a3)".

The light emitting diode 140' illustrated in FIG. 7C is shifted from the right position L1 by a second distance S2 so that an end is disposed in a position L3. In this case, the first connecting unit 555' does not overlap the p electrode 144 so that the first connecting electrode 561 is electrically insulated from the p-type layer 143. Therefore, the light emitting diode 140' may not normally operate. In this case, when a width W2' of the first connecting unit 555' is a1, a distance T2 from the edge of the light emitting diode 140' to the edge of the first connecting unit 555' can be represented as "a1−a2".

In order to normally operate the light emitting diodes 140 and 140', the distance T1 from the edge of the light emitting diode 140' illustrated in FIG. 7B to the edge of the first connecting unit 555' needs to be smaller than the distance T2 from the edge of the light emitting diode 140' illustrated in FIG. 7C to the edge of the first connecting unit 555'. For example, in order to suppress an open failure in which the first connecting electrode 561 and the p-type layer 143 are electrically insulated from each other, an inequation "{first distance S1−(a2+a3)}<(a1−a2)" needs to be satisfied. Therefore, in order to suppress the open failure of the light emitting diodes 140 and 140', the first distance S1 needs to be smaller than "a1+a3". As described above, when the first distance S1 by which the light emitting diodes 140 and 140' included in each pixel PX is shifted from the right position L1 is efficiently managed, a failure rate can be significantly reduced.

The embodiments of the present disclosure can also be described as follows.

According to an aspect of the present disclosure, there is provided a display device. The display device can include a substrate on which a semiconductor element and a common electrode are disposed; an LED which is disposed on the substrate and includes an n-type layer, a light emitting layer, and a p-type layer; an insulating layer disposed on the substrate and the light emitting diode; and a first connecting electrode which is connected to the light emitting diode and the semiconductor element. Also, the first connecting electrode can be disposed on the insulating layer and the first connecting electrode is electrically connected to the p-type layer through a first connecting unit configured by a plurality of fine holes.

According to one or more other features of the present disclosure, the display device can further include a second connecting electrode which is connected to the light emitting diode and the common electrode. Also, the second connecting electrode can be disposed on the insulating layer and the second connecting electrode is electrically connected to the n-type layer through a second connecting unit configured by a plurality of fine holes.

According to one or more other features of the present disclosure, the first connecting unit or the second connecting unit can include an elliptical fine hole.

According to one or more other features of the present disclosure, the first connecting unit or the second connecting unit can include a fine hole having a slit shape extending in one direction.

According to one or more other features of the present disclosure, the light emitting diode further can include a protective layer formed of an inorganic material and the protective layer is disposed on a side portion of the light emitting diode.

According to one or more other features of the present disclosure, the light emitting diode further can include an exposing unit through which at least a part of the n-type layer is exposed by the protective layer and the exposing unit is disposed on a side portion of the light emitting diode.

According to one or more other features of the present disclosure, the insulating layer completely can cover the exposing unit.

According to one or more other features of the present disclosure, the light emitting diode further can include a first electrode and a second electrode above the light emitting diode, the first electrode can be disposed on the p-type layer exposed by the protective layer, and the second electrode can be disposed on the n-type layer exposed by the protective layer.

According to one or more other features of the present disclosure, the first connecting unit includes a fine hole which does not overlap the first electrode in a plan view.

According to one or more other features of the present disclosure, the fine hole which may not overlap the first electrode in a plan view is not connected to the exposing unit.

According to one or more other features of the present disclosure, a depth of the fine hole included in the first connecting unit can be smaller than a depth of the fine hole included in the second connecting unit.

According to one or more other features of the present disclosure, the insulating layer can be an organic material.

According to other aspects of the present disclosure, there is provided a display device. The display device can include a substrate on which a light emitting diode array including a plurality of light emitting diodes is disposed; a semiconductor element array which is disposed on the substrate and is electrically connected to the light emitting diode array to control emission of the plurality of light emitting diodes; and a structure which suppresses the electrical short of the n-type layer and the p-type layer included in the plurality of light emitting diodes due to the misalignment of the plurality of light emitting diodes.

According to one or more other features of the present disclosure, the structure can be an insulating layer which is in direct contact with side portions of the plurality of light emitting diodes so as not to expose the n-type layer from the side portions of the plurality of light emitting diodes.

According to one or more other features of the present disclosure, the plurality of light emitting diodes can include a protective layer which is formed on the n-type layer and the p-type layer to protect the n-type layer and the p-type layer, a first exposing unit which is electrically connected to the n-type layer because the protective layer is not formed at the side portions of the light emitting diodes; and a second exposing unit which is electrically connected to the p-type layer because the protective layer is not formed at an upper portion of the light emitting diode.

According to one or more other features of the present disclosure, the display device further can include a connecting electrode which connects the second exposing unit and the semiconductor element, wherein the connecting electrode can be disposed on the structure.

According to one or more other features of the present disclosure, the structure can include a connecting unit configured by a plurality of holes, and the connecting electrode can be electrically connected to the p-type layer through the connecting unit.

According to one or more other features of the present disclosure, the structure can include a fine hole overlapping the second exposing unit and a fine hole which does not overlap the second exposing unit, and a depth of the fine hole which does not overlap the second exposing unit is smaller than a maximum thickness of the structure.

According to one or more other features of the present disclosure, the structure is formed of an organic material having an insulating property.

Although the embodiments of the present disclosure have been described in detail with reference to the accompanying drawings, it is to be understood that the present disclosure is not limited to those embodiments and various changes and modifications can be made without departing from the scope of the present disclosure. Therefore, the embodiments disclosed in the present disclosure are intended to illustrate rather than limit the scope of the present disclosure, and the scope of the technical idea of the present disclosure is not limited by these embodiments. Therefore, it should be understood that the above-described embodiments are illustrative in all aspects and not restrictive. The scope of the present disclosure should be construed according to the claims, and all technical ideas within the scope of equivalents should be construed as falling within the scope of the present disclosure.

What is claimed is:

1. A display device, comprising:
    a substrate on which a semiconductor element and a common electrode are disposed;
    a light emitting diode (LED) which is disposed on the substrate and includes an n-type layer, a light emitting layer, and a p-type layer;
    an insulating layer disposed on the substrate and the light emitting diode; and
    a first connecting electrode which is connected to the light emitting diode and the semiconductor element,
    wherein the first connecting electrode is disposed on the insulating layer, and the first connecting electrode is electrically connected to the p-type layer through a first connecting unit configured by a plurality of fine holes.

2. The display device according to claim 1, further comprising:
    a second connecting electrode which is connected to the light emitting diode and the common electrode,
    wherein the second connecting electrode is disposed on the insulating layer, and the second connecting electrode is electrically connected to the n-type layer through a second connecting unit configured by a plurality of fine holes.

3. The display device according to claim 2, wherein the first connecting unit or the second connecting unit includes at least one elliptical fine hole.

4. The display device according to claim 2, wherein the first connecting unit or the second connecting unit includes at least one fine hole each having a slit shape extending in one direction.

5. The display device according to claim 2, wherein the light emitting diode further includes a protective layer formed of an inorganic material, and the protective layer is disposed on a side portion of the light emitting diode.

6. The display device according to claim 5, wherein the light emitting diode further includes an exposing unit through which at least a part of the n-type layer is exposed by the protective layer and the exposing unit is disposed on a side portion of the light emitting diode.

7. The display device according to claim 6, wherein the insulating layer completely covers the exposing unit.

8. The display device according to claim 7, wherein the light emitting diode further includes a first electrode and a second electrode above the light emitting diode,
    the first electrode is disposed on the p-type layer exposed by the protective layer, and
    the second electrode is disposed on the n-type layer exposed by the protective layer.

9. The display device according to claim 8, wherein the first connecting unit includes a fine hole which does not overlap the first electrode in a plan view.

10. The display device according to claim 9, wherein the fine hole which does not overlap the first electrode in a plan view is not connected to the exposing unit.

11. The display device according to claim 2, wherein a depth of one of the fine holes included in the first connecting unit is smaller than a depth of one of the fine holes included in the second connecting unit.

12. The display device according to claim 1, wherein the insulating layer includes an organic material.

13. A display device, comprising:
    a substrate on which a light emitting diode array including a plurality of light emitting diodes are disposed;
    a semiconductor element array which is disposed on the substrate and is electrically connected to the light emitting diode array to control an emission of the plurality of light emitting diodes; and
    a structure disposed on the light emitting diode array to suppress an electrical short of an n-type layer and a p-type layer included in the plurality of light emitting diodes due to a misalignment of the plurality of light emitting diodes.

14. The display device according to claim 13, wherein the structure is an insulating layer which is in direct contact with side portions of the plurality of light emitting diodes so as not to expose the n-type layer from the side portions of the plurality of light emitting diodes.

15. The display device according to claim 14, wherein the plurality of light emitting diodes further include:
    a protective layer which is formed on the n-type layer and the p-type layer,
    a first exposing unit which is located at the side portions of the light emitting diodes and at least partially exposes the n-type layer by the protective layer, and
    a second exposing unit which is disposed at an upper portion of the light emitting diode and at least partially exposes the p-type layer by the protective layer.

16. The display device according to claim 15, further comprising:
    a first connecting electrode which connects the second exposing unit and the semiconductor element; and
    a second connecting electrode which connects the first exposing unit and the common electrode, wherein the first and second connecting electrodes are disposed on the structure.

17. The display device according to claim 16, wherein the structure includes a first connecting unit and a second connecting unit each of which configured by a plurality of fine holes, and the first and second connecting electrodes are electrically connected to the p-type layer and the n-type layer respectively through the first and second connecting units.

18. The display device according to claim 17, wherein the structure includes a fine hole overlapping the second exposing unit and a fine hole which does not overlap the second exposing unit, and a depth of the fine hole which does not overlap the second exposing unit is smaller than a maximum thickness of the structure.

19. The display device according to claim 16, wherein the structure includes a first connecting unit and a second connecting unit each of which configured by one hole, and the first and second connecting electrodes are electrically connected to the p-type layer and the n-type layer respectively through the first and second connecting units.

20. The display device according to claim 19, wherein at least a part of the first connecting unit does not overlap the p-type layer and the part of the first connecting unit which does not overlap the p-type layer is etched from an upper portion of the insulating layer with a depth smaller than a maximum thickness of the structure.

* * * * *